(12) United States Patent
Thompson et al.

(10) Patent No.: US 6,510,309 B1
(45) Date of Patent: Jan. 21, 2003

(54) INTERMEDIATE FREQUENCY AMPLIFIER CIRCUIT FOR USE IN RECEIVE AND TRANSMIT MODES

(75) Inventors: Philip H. Thompson, Mt. Vernon, IA (US); Paul R. Andrys, Swisher, IA (US); Ed F. Lawrence, Marion, IA (US)

(73) Assignee: Conexant Systems, Inc., Newport Beach, CA (US)

( * ) Notice: Subject to any disclaimer, the term of this patent is extended or adjusted under 35 U.S.C. 154(b) by 965 days.

(21) Appl. No.: 08/752,767

(22) Filed: Nov. 20, 1996

(51) Int. Cl.[7] .................................................. H04B 1/44
(52) U.S. Cl. .............................. 455/78; 455/73; 455/84
(58) Field of Search ............................. 455/73, 78, 84; 330/301

(56) References Cited

U.S. PATENT DOCUMENTS

| | | | | |
|---|---|---|---|---|
| 3,470,472 A | * | 9/1969 | Suzuki | 455/84 |
| 4,292,596 A | * | 9/1981 | Ishizuka et al. | 330/86 |
| 4,885,550 A | * | 12/1989 | Ferrer | 330/301 |
| 5,444,863 A | * | 8/1995 | Torii | 455/84 |
| 5,578,943 A | * | 11/1996 | Sasaki | 326/86 |
| 5,578,944 A | * | 11/1996 | Sasaki | 326/86 |
| 5,596,600 A | * | 1/1997 | Dimos et al. | 375/206 |
| 5,631,601 A | * | 5/1997 | Horsfall et al. | 455/208 |
| 5,648,985 A | * | 7/1997 | Bjerede et al. | 455/84 |
| 5,701,594 A | * | 12/1997 | Bath | 455/84 |

OTHER PUBLICATIONS

Sedra, Adel S. et al., Microelectronic Circuits, Holt Rine-Hart and Winston, p. 262, (ISBN 0–03–007328–6), 1987.*

* cited by examiner

Primary Examiner—Charles N. Appiah
(74) Attorney, Agent, or Firm—Foley & Lardner (57) ABSTRACT

An intermediate frequency amplifier for wireless communication applications has the same receive path and transmit path through an off-chip filter. The intermediate frequency amplifier circuit includes a first amplifier and a second amplifier. The second amplifier includes a gain control circuitry. The second amplifier provides gain control for both the receive mode and for the transmit mode of operation. The IF amplifier can be used in a variety of communication applications, including cordless telephones, cellular phones, PHS phones, wireless modems, radios, and other devices.

20 Claims, 5 Drawing Sheets

INTERMEDIATE FREQUENCY AMPLIFIER CIRCUIT FOR USE IN RECEIVE AND TRANSMIT MODES

FIELD OF THE INVENTION

The present invention relates generally to an amplifying circuit for high frequency and base-band applications. More particularly, the present invention relates to a radio frequency (RF) or microwave frequency amplification circuit for use in a receive mode and in a transmit mode.

BACKGROUND OF THE INVENTION

Various wireless communication systems, such as, cellular telephones, cordless telephones, wireless modems, radios, and personal handy phone systems (PHS), require intermediate frequency (IF) amplifiers which amplify or attenuate receive IF signals (.e.g., in the receive mode) and transmit IF signals (e.g., in the transmit mode). The intermediate frequency is a frequency to which a signal wave is shifted as an intermediate step in transmission or reception. The intermediate frequency can be any frequency; in radio frequency applications, the intermediate frequency is often between 1 MHz and 1 GHz.

Generally, the IF signals are amplified or attenuated by semiconductor or integrated circuit devices. In most high frequency amplification schemes, the receive IF signal and the transmit IF signal are provided through a discrete or off-chip filter to remove spacious signals outside of a band width centered at the intermediate frequency. The discrete filter is generally a physically large device which cannot be integrated on a semiconductor substrate.

Figure 1:
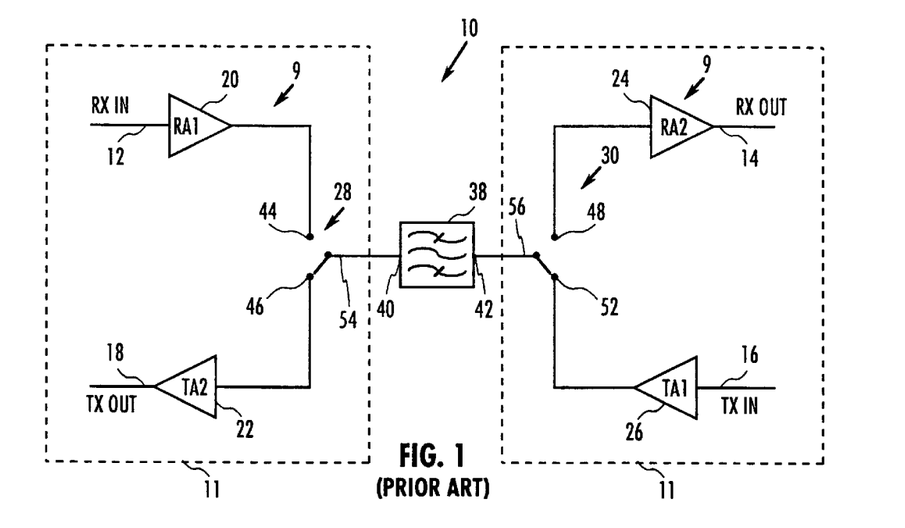
FIG. 1 is a block diagram of a prior art intermediate frequency (IF) amplifier circuit.

With reference to FIG. 1, a communication system 10 includes a conventional IF amplifier circuit 9 integrated on a semiconductor substrate 11. Circuit 9 includes a receive path amplifier 20, a transmit path amplifier 22, a receive path amplifier 24, a transmit path amplifier 26, a switch circuit 28, and a switch circuit 30. Switch circuit 28 includes a terminal 44, a terminal 46, and a common terminal 54. Switch circuit 30 includes a common terminal 56, a terminal 48, and a terminal 52.

Amplifier 20 has an input coupled to a receive path input 12 and an output coupled to terminal 44 of switch circuit 28. Amplifier 22 has an input coupled to terminal 46 of switch circuit 28 and an output coupled to transmit path output 18. Amplifier 26 has an input coupled to transmit path input 16 and an output coupled to terminal 52 of switch circuit 30. Amplifier 24 has an input coupled to terminal 28 of switch circuit 30 and an output coupled to receive path output 14.

An off-chip filter 38 is coupled between amplifiers 20 and 24 and between amplifiers 22 and 26 (e.g., between switch circuits 28 and 30). Filter 38 has a terminal 40 coupled to common terminal 54 of switch circuit 28 and a terminal 42 coupled to common terminal 56 of switch circuit 30.

In a receive mode of operation, receive IF signals are provided on receive path input 12 and amplified by amplifier 20. The amplified IF signal is provided through switch circuit 28, filter 38, and switch circuit 30 to amplifier 24. Amplifier 24 reamplifies the IF signal and provides the signal to receive path output 14. Receive path input 12 and receive path output 14 can be terminals, pins, or off-chip connections for substrate 11, or they can be internal connections to other circuit components on substrate 11.

In a transmit mode of operation, transmit IF signals are provided on transmit path input 16 and amplified by amplifier 26. The amplified IF signal is provided through switch circuit 30, filter 38, and switch circuit 28 to amplifier 22. Amplifier 22 reamplifies the IF signal and provides the transmit IF signal to transmit path output 18. Transmit path input 16 and transmit path output 18 can be terminals, pins, or off-chip connections for substrate 11, or they can be internal connections to other components on substrate 11.

Amplifier circuit 9 associated with system 10 and semiconductor substrate 11 is disadvantageous for various reasons. First, amplifier circuit 9 requires identical input/output (I/O) impedances for amplifiers 20, 22, 24, and 26. For example, the output impedance of amplifier 20 must match the input impedance for amplifier 22 as well as for filter 38. Similarly, the input impedance for amplifier 24 must match the output impedance for amplifier 26 as well as for filter 38. Matching amplifier I/O impedances is difficult and adds to the complexity of designing amplifier circuit 9 on substrate 11, especially in light of differing temperature characteristics and process variations associated with amplifiers 20, 22, 24, and 26. Second, amplifier circuit 9 requires that off-chip filter 38 be bidirectional. In the receive mode, the IF signal travels from terminal 40 to terminal 42. In the transmit mode, the IF signal travels from terminal 42 to terminal 40. Bidirectional filters are more expensive and rarely have exactly the same response characteristics in both directions. This scheme precludes the use of active filters. Third, the scheme for amplifier circuit 9 on substrate 11 requires that switch circuits 28 and 30 be bidirectional or passive. Bidirectional switches for high frequency circuits cannot easily be designed in bipolar silicon substrate integrated circuit devices. Switches must be carefully designed so as not to degrade impedances which may lead to excessively large or complicated circuitry.

Thus, there is a need for an IF amplifier circuit which can utilize unidirectional switches and unidirectional filters. Further, there is a need for an IF amplifier circuit which utilizes two amplifiers for both the receive mode and the transmit mode of operation. Further still, there is a need for an amplifier scheme where IF amplifier outputs do not have to be matched to IF amplifier inputs as well as to the off-chip filter.

SUMMARY OF THE INVENTION

The present invention relates to a high frequency amplification circuit integrated on a single substrate for use with an off-chip filter. The amplification circuit operates in a receive mode and in a transmit mode. The amplification circuit includes a first switch, a first amplifier, a second amplifier, and a second switch. The first switch has a receive input, a transmit input, and a common output. The first amplifier has a first input and a first output. The first input is coupled to the common output of the first switch. The first output is coupleable to the off-chip filter. The second amplifier has a second input coupleable to the off-chip filter and a second output. The second switch has a common input, a transmit output, and a receive output. The common input is coupled to the second output.

The present invention is further related to an intermediate frequency amplifier circuit for use in a receive mode and in a transmit mode. The intermediate frequency amplifier circuit includes a first intermediate frequency switch circuit, a first amplifier circuit, a second amplifier, and a second intermediate frequency switch circuit. The first intermediate frequency switch circuit has a receive input, a transmit input, and a first switch output. The first amplifier circuit has a first amplifier input and a first amplifier output. The first amplifier input is coupled to the first switch output. The second amplifier has a second amplifier input and a second amplifier output. The second amplifier input is in communication with the first amplifier output. The second intermediate frequency switch circuit has a second switch input, a transmit output, and a receive output. The second switch input is coupled to the second amplifier output. The intermediate frequency amplifier circuit has a unidirectional signal path through the first and second amplifiers for both the receive mode and the transmit mode.

The present invention still further relates to an intermediate frequency amplifier having a receive mode and a transmit mode. The intermediate frequency amplifier includes a first intermediate frequency switch means for coupling a receive input to a first switch output in the receive mode and for coupling a transmit input to the first switch output in the transmit mode, a first amplifier means for amplifying a signal on the first switch output, a second amplifier means for amplifying the amplified signal from the first amplifier means, and a second intermediate frequency switch means for coupling a receive output to the second amplifier means in the receive mode and for coupling a transmit output to the second amplifier means in the transmit mode.

In one exemplary aspect of the present invention, the receive path and the transmit path for two IF amplifier stages are the same. Attenuation or gain control circuitry can be provided with one of the two amplifier stages for gain control in both the receive mode and in the transmit mode of operation. The gain control circuitry includes a matrix of switched resistors.

In another exemplary aspect of the present invention, a first amplifier receives the signal on either the receive path input or on the transmit path input, and a second amplifier provides the amplified signal to the receive path output or to the transmit path output. An off-chip filter can be employed between the first amplifier and the second amplifier. The filter can be unidirectional and has the same filter characteristics and impedance for both the receive mode and the transmit mode. Additionally, unidirectional switches, as opposed to bidirectional switches or passive switches, can be utilized.

According to yet another aspect of the present invention, the IF amplifier circuit includes two amplifiers. The first amplifier is a totem pole amplifier, including a current mirror. The second amplifier includes a common mode transistor amplifier and a common gate transistor amplifier. The first amplifier combines differential signals into a single signal for input to an off-chip filter, and the second amplifier splits the single signal from the filter and provides a differential output signal.

In still a further aspect of the present invention, the IF amplifier circuit is preferably part of an integrated circuit in a communication device, such as, a personal handy phone system. The IF amplifier operates at a frequency of approximately 250 MHz for a system which transmits and receives RF signals at approximately 1.9 GHz. The IF amplifier circuit provides the transmit signal and the receive signal to other on-chip devices.

BRIEF DESCRIPTION OF THE DRAWINGS

Exemplary embodiments of the present invention will hereinafter be described wherein like numerals denote like elements and.

DETAILED DESCRIPTION OF THE PREFERRED EXEMPLARY EMBODIMENTS OF THE PRESENT INVENTION

Figure 2:
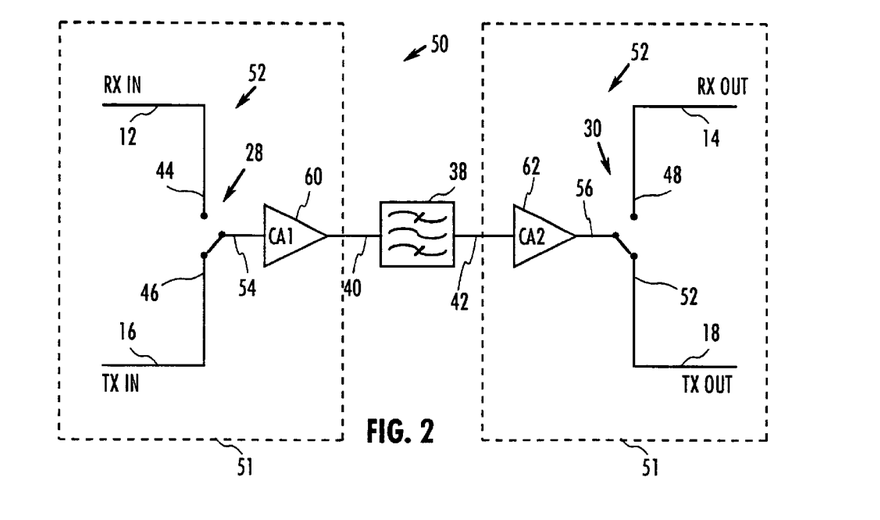
FIG. 2 is a general block diagram of an IF amplifier circuit in accordance with an exemplary embodiment of the present invention.

With reference to FIG. 2, a communication system 50 includes an amplifier circuit 52 disposed on a single semiconductor substrate 51. Amplifier circuit 52 has components similar to amplifier circuit 9 discussed with reference to FIG. 1. However, amplifier circuit 52 requires only two amplifiers, such as, an amplifier 60 and an amplifier 62, instead of four amplifiers, such as, amplifiers 20, 22, 24, and 26 (see FIG. 1).

Receive path input 12 is coupled to terminal 44 of switch circuit 28. Transmit path input 16 is coupled to terminal 46 of switch circuit 28. Common terminal 54 of switch circuit 28 is coupled to an input of amplifier 60. An output of amplifier 60 is coupled to terminal 40 of off-chip filter 38.

Terminal 42 of off-chip filter 38 is coupled to an input of amplifier 62. An output of amplifier 62 is coupled to a common terminal 56. Receive path output 14 is coupled to terminal 48 of switch circuit 30, and transmit path output 18 is coupled to terminal 52 of switch circuit 30.

Off-chip filter 38 is preferably a surface acoustic wave (SAW) filter having pass band frequency centered at approximately 250 MHz (e.g., 248 MHz). Filter 38 is a discrete or off-chip device (separate from substrate 51). Alternatively, other types of IF filters can be utilized. As stated with reference to FIG. 1, receive path input 12, receive path output 14, transmit path input 16, and transmit path output 18 can be terminals, pins, off-chip connections, or internal connections on substrate 51. Inputs 12 and 16 and outputs 14 and 18 can be differential inputs or outputs as well as single-ended inputs and outputs.

The operation of communication system 50 is described below with reference to FIG. 2. In the receive mode, a receive IF signal is provided on receive path input 12. The receive IF signal on input 12 is provided through switch circuit 28 to amplifier 60. Amplifier 60 amplifies the IF signal on receive path input 12 and provides the amplified IF signal to terminal 40 of filter 38. Filter 38 filters the amplified IF signal and provides the filtered, amplified IF signal to terminal 42. Amplifier 62 amplifies the filtered, amplified IF signal on terminal 42 and provides the reamplified, filtered IF signal to switch circuit 30. Switch circuit 30 provides the reamplified filtered IF signal to receive path output 14.

In the transmit mode, the transmit IF signal is provided on transmit path input 16 through switch circuit 28 to amplifier 60. Just as with the receive IF signal, amplifier 60 amplifies the transmit IF signal and provides the amplified IF signal to terminal 40 of filter 38. Filter 38 provides the filtered, amplified IF signal to terminal 42. Amplifier 62 amplifies the filtered, amplified IF signal at terminal 42 and provides the reamplified, IF signal through switch circuit 30 to transmit output 18.

Thus, IF amplifier circuit 52 advantageously has the same circuit or signal path through amplifier 60, filter 38, and amplifier 62 for both receive IF signals and for the transmit IF signals. Additionally, the receive IF signal, the transmit IF signal, the reamplified receive IF signal and the reamplified transmit IF signal have the same signal path. The signal path for both the receive IF signal and for the transmit IF signal is through common terminal 54 of switch circuit 28. This same signal path is used by both the reamplified receive IF signal and by the reamplified transmit IF signal through common terminal 56 of switch circuit 30. Thus, unidirectional switch circuits 28 and 30 and unidirectional filters 38 can be utilized in amplifier circuit 52. Additionally, only two amplifiers, such as, amplifier 60 and 62, are required because each amplifier performs both the receive mode functions and the transmit mode functions. Separate amplifiers for each mode are not needed.

With the advantageous scheme of amplifier circuit 62, the output impedance of amplifier 60 does not have to be directly matched to the input impedance of amplifier 62 because they are not directly coupled together. Also, switch circuits 28 and 30 can be placed at non-controlled impedance interfaces rather than between filter 38 and amplifiers 20, 22, 24, and 26 (See FIG. 1). Further still, a gain control circuit or limiting circuit can be built into either amplifier 60 or 62 to provide gain control operations in both receive modes and in transmit modes; separate receive mode and transmit mode gain control circuits are not needed.

Figure 3:
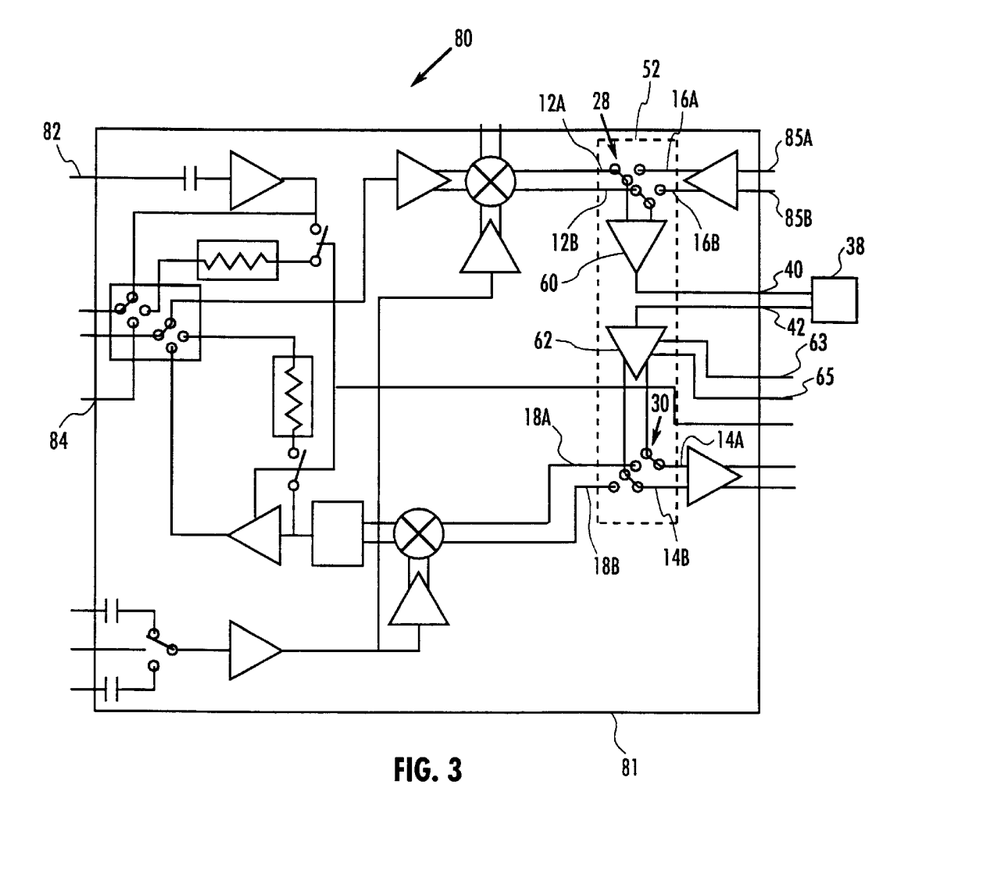
FIG. 3 is a block diagram of the amplifier circuit illustrated in FIG. 2 disposed in an RF communication system in accordance with another exemplary embodiment of the present invention.

With reference to FIG. 3, amplifier circuit 52 is included in a radio frequency circuit 80 which is integrated on a gallium arsenide (GaAs) semiconductor substrate 81. Amplifier circuit 52 is shown substantially similar to the circuit 52 illustrated in FIG. 2. However, receive path input 12 (FIG. 2) now includes differential inputs 12a and 12b, and transit path input 16 (FIG. 2) now includes differential inputs 16a and 16b. Similarly, receive path output 14 (FIG. 2) now includes differential outputs 14a and 14b, and transmit path output 18 (FIG. 2) now includes differential outputs 18a and 18b. Amplifier 60 is a combiner which provides a single-ended output, and amplifier 62 is a splitter which provides a differential output.

Amplifier 62 includes a gain control input 63 and a gain control input 65. Circuits (not shown) within substrate 81 or external to substrate 81 may provide signals on inputs 63 and 65 to adjust the gain or the attenuation of amplifier 62.

In the receive mode of operation, circuit 80 receives a high frequency 1.9 GHz RF signal at a receive input 82. The RF signal is stepped down to a differential IF receive signal (e.g., 250 MHz) which is provided to receive path inputs 12a and 12b. The differential receive IF signal is provided through switch circuit 28, amplifier 60, filter 38, amplifier 62, and switch circuit 30 to receive path outputs 14a and 14b as a reamplified, filtered differential IF signal.

In the transmit mode of operation, a differential transmit IF signal (e.g., 250 MHz) at differential inputs 85a and 85b is amplified and provided to transmit path inputs 16a and 16b through switch circuit 28, amplifier 60, filter 38, amplifier 62, and switch circuit 30 to transmit path outputs 18a and 18b as a reamplified, filtered differential IF signal. The reamplified, filtered differential IF signal is provided to an up converter which converts the reamplified, filtered IF signal to a 1.9 GHz RF signal. The RF signal is output from circuit 80 at RF transmit output 84.

Figure 4:
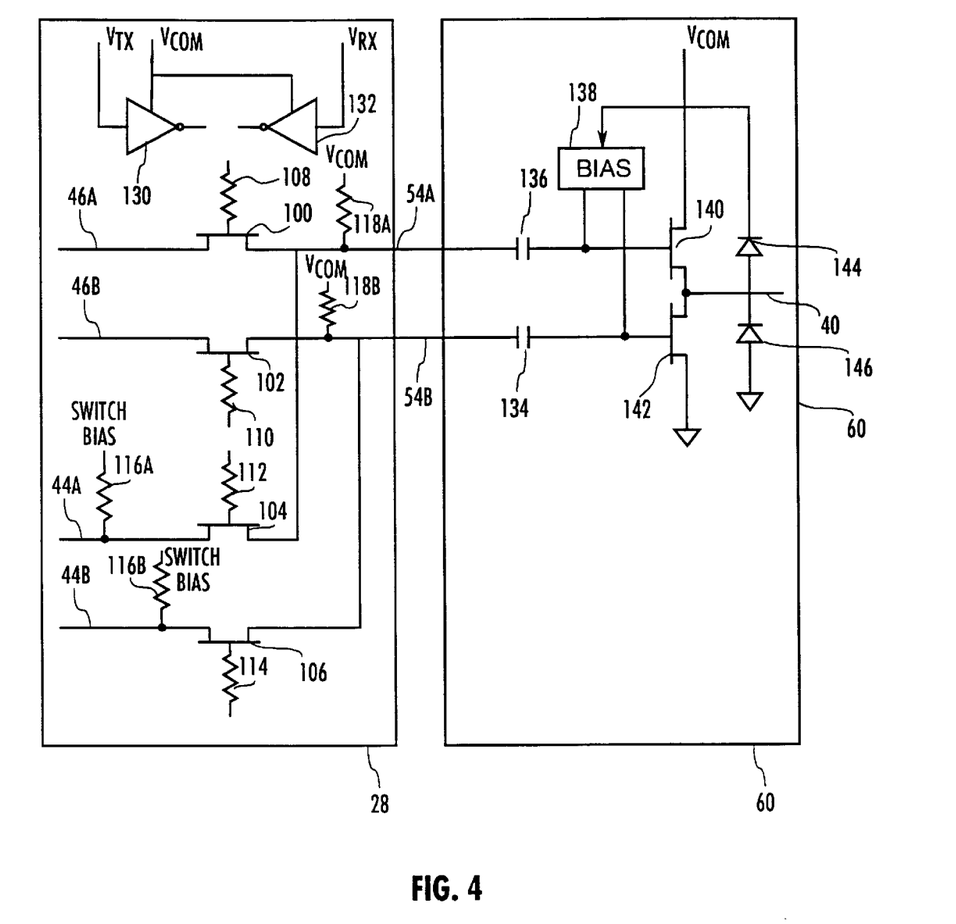
FIG. 4 is a more detailed schematic block diagram of a first amplifier and a first switch circuit illustrated in FIG. 2.

With reference to FIG. 4, switch circuit 28 includes differential receive input terminals 44a and 44b, differential transmit input terminals 46a and 46b, and differential common output terminals 54a and 54b. Circuit 28 also includes a transistor 100, a transistor 102, a transistor 104, and a transistor 106.

Transistors 100, 102, 104, and 106 are preferably MESFET transistors which are controlled through gate bias resistors 108, 110, 112, and 114, respectively. Transistors 100 and 102 are controlled by an inverse receive mode signal provided from an inverter 130, and transistors 104 and 106 are controlled by an inverse transmit mode signal provided by an inverter 132.

Resistors 118a and 118b are coupled to a switch bias supply (e.g., 1.5V) which allows transistors 100, 102, 104, and 106 to be effectively turned on and off. A resistor 116b and a resistor 116b are coupled between a 3 volt source (VCOM) and terminals 44a and 44b. Resistors similar to resistors 116 and 117 can be provided for terminals 46a and 46b. However, amplifiers or other circuitry coupled to terminals 46a and 46b can perform the function of raising the DC voltage on inputs 46a and 46b for proper operation of transistors 100 and 102.

Common terminals 54a and 54b of circuit 28 are coupled to amplifier 60. Amplifier 60 includes a decoupling capacitor 134, a decoupling capacitor 136, a bias circuit 138, a transistor 140, a transistor 142, a diode 144, and a diode 146. Transistors 140 and 142 provide a totem pole amplifier having approximately an 8 dB gain. Amplifier 60 has a high input impedance which minimizes capacitors 134 and 136 and an output impedance of approximately 50 ohms to match filter 38.

Decoupling capacitors 134 and 136 have a very small capacitance, such as, ten picofarad (pF). Diodes 144 and 146 provide electrostatic discharge protection. The operation of bias circuit 138 is described in more detail with reference to FIG. 6. Amplifier 60 combines the signals on terminals 54a and 54b to a single-ended signal for filter 38 through terminal 40.

Figure 5:
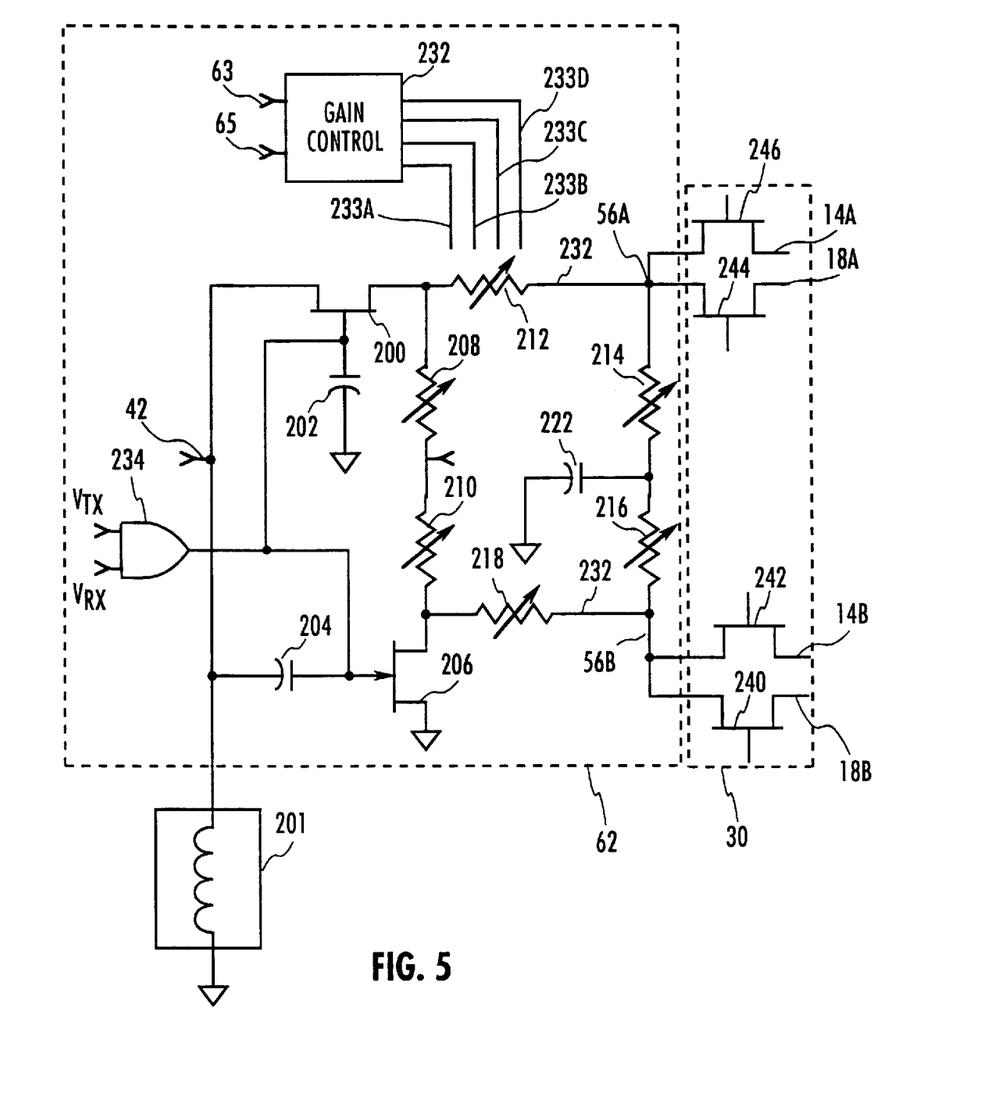
FIG. 5 is a more detailed schematic block diagram of a second amplifier and a second switch circuit illustrated in FIG. 2.

With reference to FIG. 5, amplifier 62 includes a transistor 200, a bypass capacitor 202, a bypass capacitor 204, a transistor 206, a switched resistor 208, a switched resistor 210, a switched resistor 212, a switched resistor 214, a switched resistor 216, a switched resistor 218, a capacitor 222, a gain control circuit 232, and a logic circuit 234. Transistors 200 and 206 cooperate to split the signal provided at terminal 42 and to amplify the signal as a differential signal.

Transistor 206 is a common source amplifier which provides an amplified signal to common switch terminal 56b of switch circuit 30. Transistor 200 is a common gate amplifier which provides an amplified signal 180 degrees out of phase with the amplified signal from transistor 206 to common switch terminal 56a of switch circuit 30.

The amplified signals are transmitted through a matrix of switched resistors 208, 210, 212, 214, 216, and 218 to provide attenuation or gain control for amplifier 62. Switched resistors 212 and 218 are comprised of a resistor coupled in parallel with a control transistor, such as, an FET. Switched resistors 208, 210, 214, and 216 include a control transistor, such as, an FET, coupled in series with a resistor. Signals from output 233a–d of gain control circuit 232 turn on and off the switches associated with switched resistors 208, 210, 212, 214, 216, and 218 to adjust the gain of amplifier 62.

Circuit 232 controls the switches in response to signals on gain control inputs 63 and 65. Preferably, circuit 232 can adjust the gain of amplifier 62 in 6 dB steps from +6 dB to −12 dB. Circuit 232 allows amplifier 62 to be configured for the different gains necessary for the receive IF signal and for the transmit IF signal. The receive IF signal must often be amplified more than the transmit IF signal, particularly in PHS systems.

Capacitors 202 and 204 couple the gates of transistors 200 to alternating current (AC) ground. Capacitor 204 couples the gate of transistor 206 to node 42. Capacitors 202 and 204 preferably have a capacitance of 10 pF. The source of transistor 200 is coupled to DC ground through a 100–500 nanoHenry (nH) choke 201. Amplifier 62 preferably has a low input impedance of approximately 50 ohms to match filter 38 and a high output impedance.

Logic circuit 234 provides gate bias to transistors 200 and 206 to effectively turn off amplifier 62 when circuit 50 is neither in a receive mode nor in a transmit mode. Circuit 234 responds to a receive mode signal and a transmit mode signal to determine if either the receive mode or the transmit mode is present.

Switch circuit 30 receives the reamplified, filtered IF signal on common terminals 56a and 56b and provides the reamplified signals to either transmit path outputs 18a and 18b or receive path outputs 14a and 14b. Switch circuit 30 is similar to switch circuit 28 and includes a transistor 240, a transistor 242, a transistor 244, and a transistor 246. Transistors 240, 242, 244, and 246 are MESFET transistors which are controlled similarly to transistors 100, 102, 104 and 106 illustrated in FIG. 4.

Switch circuits 38 and 30 are preferably passive switch devices (FIG. 2). Alternatively, switch devices 28 and 30 can be replaced with unidirectional switches, such as, those made with bipolar transistors on a silicon substrate.

Figure 6:
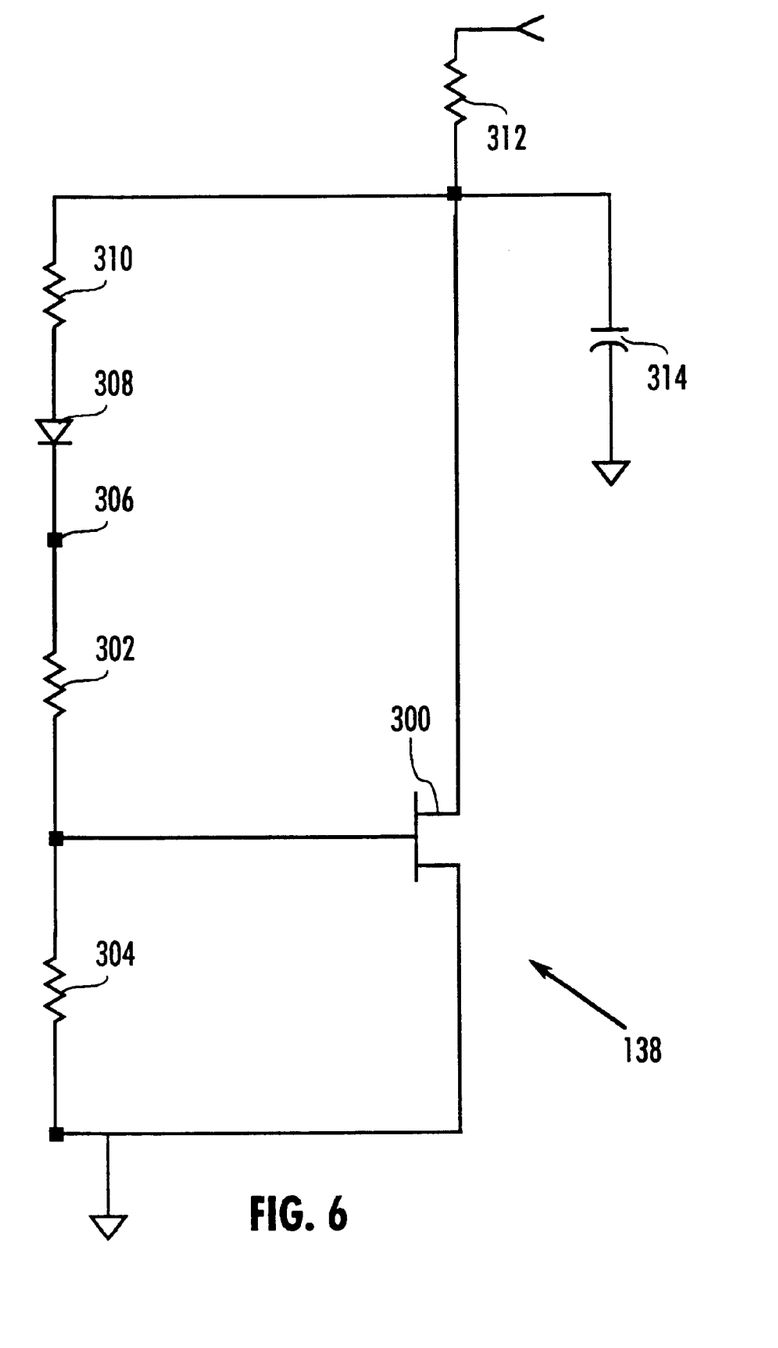
FIG. 6 is a more detailed schematic block diagram of a bias circuit illustrated in FIG. 4.

With reference to FIG. 6, bias circuit 138 is essentially a constant current mirror which controls transistors 140 and 142 (FIG. 4). Circuit 138 includes a resistor 302, a resistor 304, a gate bias terminal 306, a diode 308, a resistor 310, a resistor 312, a capacitor 314, and a transistor 300.

Transistor 300 is sized with respect to transistor 142 (FIG. 4) to be approximately one-tenth the size. Resistor 302 is preferably a 3 kiloohm (Kohm) resistor. Resistor 304 is preferably a 3.5 Kohm resistor. Resistor 310 is preferably a 6.5 Kohm resistor and resistor 312 is preferably a 2.2 Kohm resistor.

Circuit 138 provides the bias signal at terminal 306 to control transistors 140 and 142. Terminal 306 is coupled to the gate of transistor 142 (FIG. 4). The gate of transistor 140 is biased with a constant such as from a resistive network (not shown). The voltage across resistor 312 drops when transistor 300 draws too much current and thereby lowers the voltage provided at terminal 306. Similarly, if less current is drawn by transistor 300, the voltage drop across resistor 312 is lessened, and the voltage at terminal 302 is increased.

It is understood that, while the detailed drawings, specific examples, and particular component values given describe a preferred exemplary embodiment of the present invention, they are for the purpose of illustration only. The apparatus and method of the invention is not limited to the precise details and conditions disclosed. For example, although the amplifiers utilize totem pole transistors, common source amplification, and common gate amplification, other types of amplifiers can be utilized. Also, although the gain control is disclosed as a matrix of resistors having parallel shorting switches, other types of gain control circuits can be utilized. Thus, various changes may be made to the details disclosed without departing from the scope of the spirit of the invention which is defined by the following claims.

What is claimed is:

1. A high frequency amplification system, comprising:
an off-chip filter and a high frequency amplification;
circuit integrated on a single substrate, the amplification circuit operating in a receive mode and in a transmit mode, the amplification circuit comprising:
a first switch having a receive input, a transmit input, and a common output;
a first amplifier having a first input and a first output, the first input coupled to the common output of the first switch, the first output coupleable to the off-chip filter;
a second amplifier having a second input coupleable to the off-chip filter and a second output; and
a second switch having a common input, a transmit output, and a receive output, the common input being coupled to the second output.

2. The amplification system of claim 1 wherein in the receive mode, the first switch couples the receive input to the common output, and the second switch couples the common input to the receive output, and in the transmit mode, the first switch couples the transmit input to the common output, and the second switch couples the common input to the transmit output.

3. The amplification system of claim 2 wherein the signal path through the first amplifier and the second amplifier is the same in the receive mode and in the transmit mode.

4. The amplification system of claim 3 further comprising:
a gain control circuit coupled to the second amplifier, the gain control circuit adjusting the gain of the second amplifier.

5. The amplification system of claim 4 wherein the gain control circuit includes a resistive network.

6. The amplification system of claim 1 wherein the receive input and the transmit input are differential inputs, the first output is a single output, the second input is a single input, and the second output is a differential output.

7. The amplification system of claim 1 wherein the first and second switches are unidirectional.

8. An intermediate frequency amplifier system, comprising:
an off-chip filter; and
an intermediate frequency amplifier;
circuit integrated on a single semiconductor substrate and for use in a receive mode and in a transmit mode, the intermediate frequency amplifier circuit comprising:
a first intermediate frequency switch circuit having a receive input, a transmit input, and a first switch output;
a first amplifier circuit having a first amplifier input and a first amplifier output, the first amplifier input coupled to the first switch output;
a second amplifier having a second amplifier input and a second amplifier output, the second amplifier input being in communication with the first amplifier output through the off-chip filter; and
a second intermediate frequency switch circuit having a second switch input, a transmit output, and a receive output; the second switch input being coupled to the second amplifier output, wherein the intermediate frequency amplifier circuit has a unidirectional signal path through the first and second amplifiers for both the receive mode and the transmit mode.

9. The intermediate frequency amplifier circuit of claim 8 wherein in the receive mode, the first intermediate frequency switch circuit couples the receive input to the first switch output, and the second intermediate frequency switch circuit couples the second switch input to the receive output, and in the transmit mode, the first intermediate frequency switch circuit couples the transmit input to the first switch output, and the second intermediate frequency switch circuit couples the second switch input to the transmit output.

10. The intermediate frequency amplifier circuit of claim 8 further comprising:
a gain control circuit coupled to the second amplifier, the gain control circuit adjusting the gain of the second amplifier.

11. The intermediate frequency amplifier circuit of claim 8 wherein the first amplifier is a totem pole amplifier.

12. The intermediate frequency amplifier circuit of claim 8 wherein the second amplifier includes a common gate amplifier and a common source amplifier.

13. The intermediate frequency amplifier circuit of claim 10 wherein the gain control circuit includes a resistive network and FET switches.

14. The intermediate frequency amplifier circuit of claim 8 wherein the circuit is implemented on a GaAs substrate.

15. The intermediate frequency amplifier circuit of claim 8 wherein the first and second amplifiers include MESFETs.

16. An intermediate frequency amplifier system, comprising:
an off-chip filter; and
an intermediate frequency amplifier circuit integrated on a single semiconductor substrate and having a receive mode and a transmit mode, the intermediate frequency amplifier comprising:
first intermediate frequency switch means for coupling a receive input to a first switch output in the receive mode and for coupling a transmit input to the first switch output in the transmit mode;
first amplifier means for amplifying a signal on the first switch output;
second amplifier means for amplifying the amplified signal from the first amplifier means the off-chip filter being coupled between the first amplifier means and the second amplifier means; and
a second intermediate frequency switch means for coupling a receive output to the second amplifier means in the receive mode and for coupling a transmit output to the second amplifier means in the transmit mode.

17. The amplifier of claim 16 wherein the receive input and the transmit input are differential inputs, and the receive output and transmit output are differential outputs.

18. The amplifier of claim 16 wherein the single semiconductor substrate is GAAs.

19. The amplifier of claim 16 wherein the first amplifier means includes a current mirror coupled to a totem pole amplifier circuit.

20. The amplifier of claim 19 wherein the second amplifier means includes a common gate amplifier and a common source amplifier.

* * * * *

UNITED STATES PATENT AND TRADEMARK OFFICE
CERTIFICATE OF CORRECTION

PATENT NO.   : 6,510,309 B1
DATED        : January 21, 2003
INVENTOR(S)  : Thompson et al.

It is certified that error appears in the above-identified patent and that said Letters Patent is hereby corrected as shown below:

<u>Column 8,</u>
Line 5, insert -- ; -- after "filter"
Line 5, remove ";" after "amplification"
Line 46, remove ";" after "amplifier"

Signed and Sealed this

Fifteenth Day of July, 2003

JAMES E. ROGAN
*Director of the United States Patent and Trademark Office*